United States Patent [19]
Ohmori et al.

[11] Patent Number: 5,379,785
[45] Date of Patent: Jan. 10, 1995

[54] CLEANING APPARATUS

[75] Inventors: Masashi Ohmori, Itami; Satoru Kotoh; Shinji Nakajima, both of Amagasaki, all of Japan

[73] Assignee: Mitsubishi Denki Kabushiki Kaisha, Tokyo, Japan

[21] Appl. No.: 849,455

[22] Filed: Mar. 11, 1992

[30] Foreign Application Priority Data

Oct. 9, 1991 [JP] Japan .................. 3-262287

[51] Int. Cl.6 .................................. B08B 3/10
[52] U.S. Cl. .................... 134/184; 134/902
[58] Field of Search .......... 134/184, 1, 902, 25.4; 366/355; 15/268, 77; 101/382.1, 383; 248/466, 488, 490, 494

[56] References Cited

U.S. PATENT DOCUMENTS

| | | | |
|---|---|---|---|
| 2,828,231 | 3/1958 | Henry | 134/102.1 X |
| 3,433,669 | 3/1969 | Kouril | |
| 4,528,997 | 7/1985 | Hoppestad et al. | 134/184 |
| 4,543,130 | 9/1985 | Shwartzman | |
| 4,763,677 | 8/1988 | Miller | 134/184 X |
| 4,836,684 | 6/1989 | Javorik et al. | 134/184 |
| 4,858,875 | 8/1989 | Nielsen | 248/488 |
| 4,869,278 | 9/1989 | Bran | 134/184 |
| 4,886,082 | 12/1989 | Kato et al. | 134/184 |
| 4,902,350 | 2/1990 | Steck | 134/902 |
| 4,991,609 | 2/1991 | Browing | 134/184 X |
| 5,088,510 | 2/1992 | Bannon | 134/184 |
| 5,113,881 | 5/1992 | Lin et al. | 134/184 |
| 5,133,376 | 7/1992 | Samarin et al. | 134/184 |

FOREIGN PATENT DOCUMENTS

| | | | |
|---|---|---|---|
| 2620243 | 12/1976 | Germany . | |
| 613531 | 12/1960 | Italy | 248/488 |
| 2-253620 | 3/1989 | Japan . | |
| 3-116731 | 5/1991 | Japan | 134/902 |
| 3-153029 | 7/1991 | Japan | 134/902 |
| 3-209822 | 9/1991 | Japan | 134/902 |
| 660735 | 5/1975 | U.S.S.R. | 134/184 |

*Primary Examiner*—Frankie L. Stinson
*Attorney, Agent, or Firm*—Leydig, Voit & Mayer

[57] ABSTRACT

A cleaning apparatus and a cleaning method effectively clean the entire surface of a substrate to be cleaned by uniformly irradiating ultrasonic waves to the substrate. Ultrasonic waves generated by an ultrasonic oscillator provided on the side wall of an outer tank are transmitted through an ultrasonic wave transmission medium provided between the outer tank and an inner tank, for example, water, and are irradiated on a substrate to be cleaned, for example, a semiconductor wafer, in the inner tank through a cleaning chemical in the inner tank. By irradiating the ultrasonic waves from the side of the cleaning apparatus, a support base blocks the least amount of ultrasonic waves from reaching the substrate. This is effective to uniformly clean the substrate.

13 Claims, 7 Drawing Sheets

CLEANING APPARATUS

BACKGROUND OF THE INVENTION

1. Field of the Invention

The present invention relates to a cleaning apparatus and a cleaning method, and more particularly, to a cleaning apparatus and a cleaning device for, for example, removing foreign matter by uniformly irradiating the entire substrate to be cleaned in a cleaning tank with ultrasonic waves.

2. Description of the Related Art

FIG. 11 is a schematic cross-sectional view of a conventional cleaning apparatus for cleaning a semiconductor wafer in a chemical tank by utilizing ultrasonic vibrations. In this cleaning apparatus, an inner tank 2 (generally made of quartz) is charged with a chemical 19 prepared for removing foreign matter or contaminants from a substrate to be cleaned 4, for example, a mixture of $NH_4OH$, $H_2O_2$ and pure water. The cleaning chemical 19 overflowing from the inner tank 2 is received by an overflow tank 3 provided outside of the inner tank 2. The chemical 19 in the overflow tank 3 is filtered by a filter (not shown), and then returned to the inner tank 2 by a circulating pump (not shown). The chemical 19 in the inner tank 2 is thus kept clean. If it is desired to keep the temperature of the chemical 19 in the inner tank 2 from 40° C. to 70° C., a heater (not shown) sealed by a quartz tube may be disposed within the inner tank 2.

Both the inner and overflow tanks 2 and 3 are held in an outer tank 9. A liquid serving as the ultrasonic wave transmission medium 8, for example, water, is present at the bottom of the outer tank 9. The bottom surface of the inner tank 2 is in contact with this ultrasonic wave transmission medium 8. At least part of the bottom surface of the outer tank 9 is an ultrasonic wave radiating plate 6. On the undersurface of the radiating plate 6 is provided a plurality of ultrasonic wave oscillators 7. A wafer basket 1 holds a plurality of substrates 4 to be cleaned in a vertical direction as viewed in FIG. 11. The wafer basket 11 is positioned by a basket guide 5 in the inner tank 2.

In the conventional cleaning apparatus arranged in the manner described above, to clean the substrate 4 ultrasonic waves are irradiated into the ultrasonic wave transmission medium 8 from the ultrasonic oscillators 7 through the ultrasonic wave radiating plate 6. The irradiated ultrasonic waves pass through the bottom of the inner tank 2 and are transmitted to the chemical 19. At that time, ultrasonic energy vibrates the chemical 19 at a frequency determined by the ultrasonic oscillators 7. The vibrated chemical 19 physically acts on the surface of the substrate 4 to be cleaned. Hence, the surface of the substrate 4 to be cleaned is sufficiently cleaned due to a combination of chemical cleaning action of the chemical 19 and physical cleaning action of the ultrasonic vibrations.

The lower portion of the wafer basket 1 is generally narrowed to form a wafer supporting portion 20 for holding the substrate 4 to be cleaned. The wafer supporting portion 20 damps ultrasonic vibrations which are transmitted from the bottom surface of the inner tank 2 in an upward direction into the chemical 19. More specifically, ultrasonic vibrations are not transmitted sufficiently to peripheral areas 10 of the substrate 4 to be cleaned which are located above the wafer supporting portion 20, as shown by the X marks on the substrate 4 to be cleaned of FIG. 11. Therefore, the peripheral areas 10 of the substrate 4 to be cleaned are not subjected to the physical action of the ultrasonic vibrations and thus are not sufficiently cleaned, as shown in FIG. 12. FIG. 12 shows how the substrate 4 to be cleaned is cleaned with time. Cleaning of the peripheral areas 10 due to the chemical action of the chemical 19 alone takes a long time.

The above-described type of conventional cleaning apparatus and cleaning method have a drawback in that ultrasonic vibrations are not sufficiently transmitted to the peripheral portion of the substrate 4 to be cleaned and the entire substrate 4 to be cleaned cannot thus be cleaned uniformly, efficiently and thoroughly.

SUMMARY OF THE INVENTION

Accordingly, an object of the present invention is to provide a cleaning apparatus and a cleaning method for cleaning the entire semiconductor wafer uniformly, efficiently and thoroughly.

To achieve the above object, the present invention provides a cleaning apparatus which comprises a support base for supporting a substrate to be cleaned, an inner tank for accommodating the substrate to be cleaned and the support base, the inner tank being charged with a cleaning chemical, an outer tank disposed around the inner tank, the outer tank being charged with a ultrasonic wave transmission medium, and an ultrasonic oscillator disposed on an outer wall of the outer tank for irradiating ultrasonic waves toward the substrate to be cleaned in the inner tank.

The present invention further provides a cleaning method which comprises the steps of placing an ultrasonic wave transmission in an outer tank with an ultrasonic oscillator provided on a side wall thereof, placing a substrate to be cleaned in an inner tank disposed in the outer tank and containing a cleaning chemical, and irradiating ultrasonic waves toward the substrate to be cleaned from the side of the outer tank to clean the substrate to be cleaned.

DETAILED DESCRIPTION OF THE PREFERRED EMBODIMENTS

First Embodiment

Figure 1:
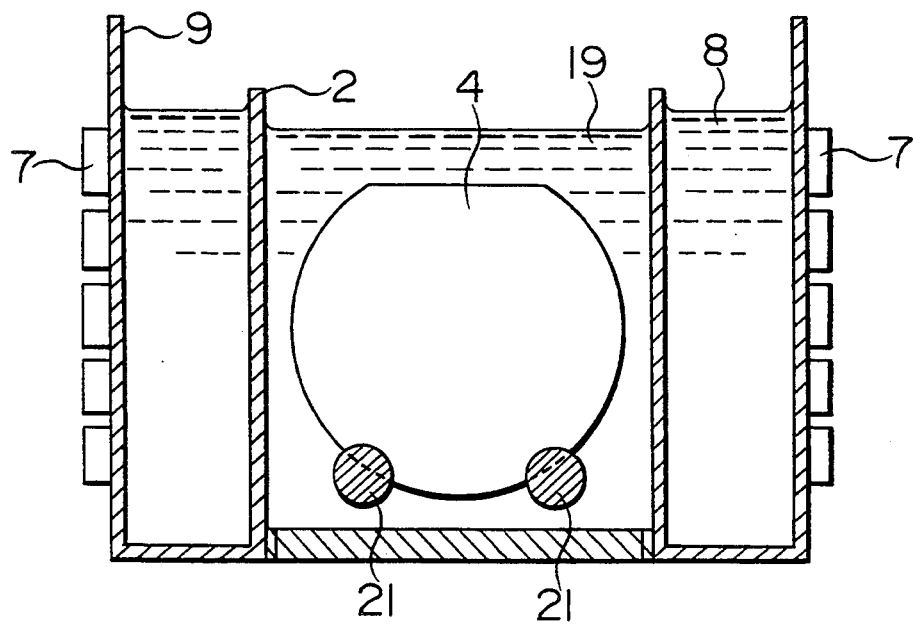
FIG. 1 is a schematic cross-sectional view of a first embodiment of a cleaning apparatus according to the present invention.

FIG. 1 is a schematic cross-sectional view of a first embodiment of a semiconductor wafer cleaning apparatus according to the present invention. The same reference numerals are used to denote parts which are the same throughout the figures. The cleaning apparatus shown in these figures has an inner tank 2 and an outer tank 9 which are used as the cleaning tanks. In the inner tank 2, a plurality of substrates 4 to be cleaned, for example, semiconductor wafers, are held by supporting bases 21. The inner tank 2 is charged with a cleaning chemical 19, for example, an organic liquid, acid or alkali. Ultrasonic oscillators 7 for generating ultrasonic waves at a frequency range from 10 KHz to several tens of MHz are provided on the side wall of the outer tank 9. The ultrasonic waves generated by the ultrasonic oscillators 7 are transmitted through the ultrasonic wave transmission medium 8, for example, water, disposed between the outer tank 9 and the inner tank 2 into the chemical 19 in the inner tank 2.

Figure 2:
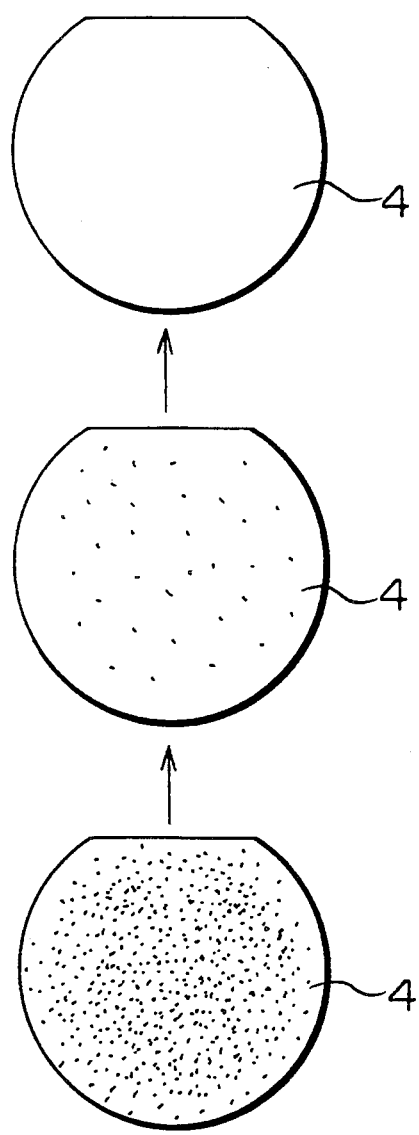
FIG. 2 is a plan view of a substrate to be cleaned, illustrating how contamination of a substrate to be cleaned changes when the substrate is cleaned by the cleaning apparatus according to the present invention.

In the cleaning apparatus arranged in the manner described above, ultrasonic waves generally propagate in a straight line. When the substrate 4 is cleaned by the chemical 19, it can be more effectively cleaned by applying ultrasonic waves to the substrate 4 to be cleaned. When ultrasonic waves are irradiated from the side of the cleaning apparatus by the ultrasonic oscillators 7, as shown in FIG. 1, the supporting bases 21 block the least amount of ultrasonic waves from reaching the substrate 4. Hence, the substrate 4 to be cleaned can be uniformly and effectively cleaned. In other words, the substrate 4 is cleaned over the entire surface thereof, as shown in FIG. 2.

Second Embodiment

Figure 3:
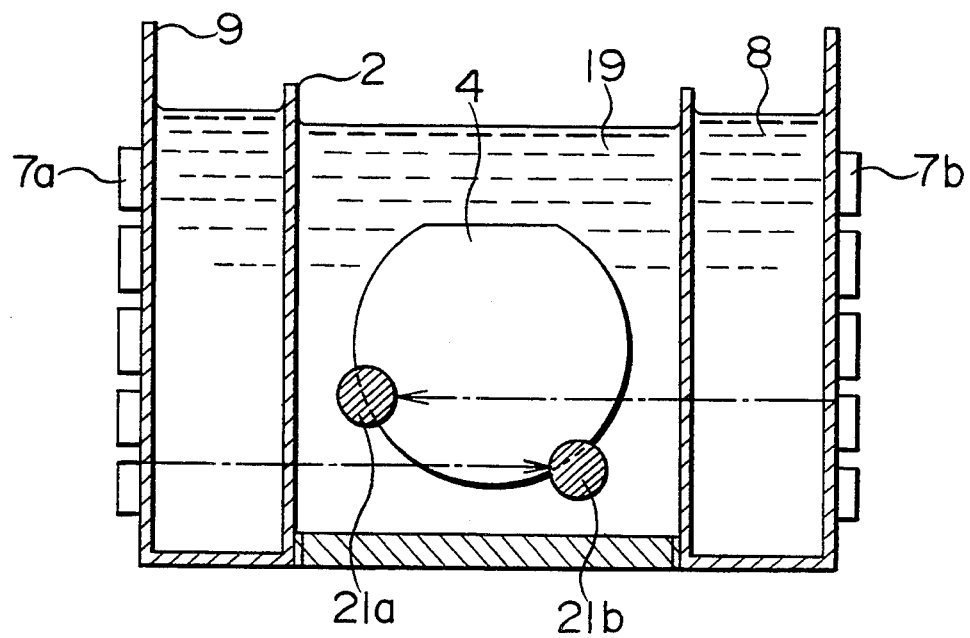
FIG. 3 is a schematic cross-sectional view of a second embodiment of the cleaning apparatus according to the present invention.

FIG. 3 is a schematic cross-sectional view of a second embodiment of the cleaning apparatus according to the present invention. In this apparatus, the substrate 4 is supported by supporting bases 21a and 21b which are disposed at different levels such that the support base 21a does not block the ultrasonic waves generated by ultrasonic oscillators 7a from reaching the support base 21b while the support base 21b does not block the ultrasonic waves generated by ultrasonic oscillators 7b from reaching the support base 21a. Thus, at any level above the bottom of the inner tank 2, the substrate 4 is contacted by at most one of the supporting bases 21a and 21b.

In this apparatus, since ultrasonic waves are not blocked when from the substrate 4, the substrate can be uniformly and effectively cleaned over the entire surface thereof.

Third Embodiment

Figure 4:
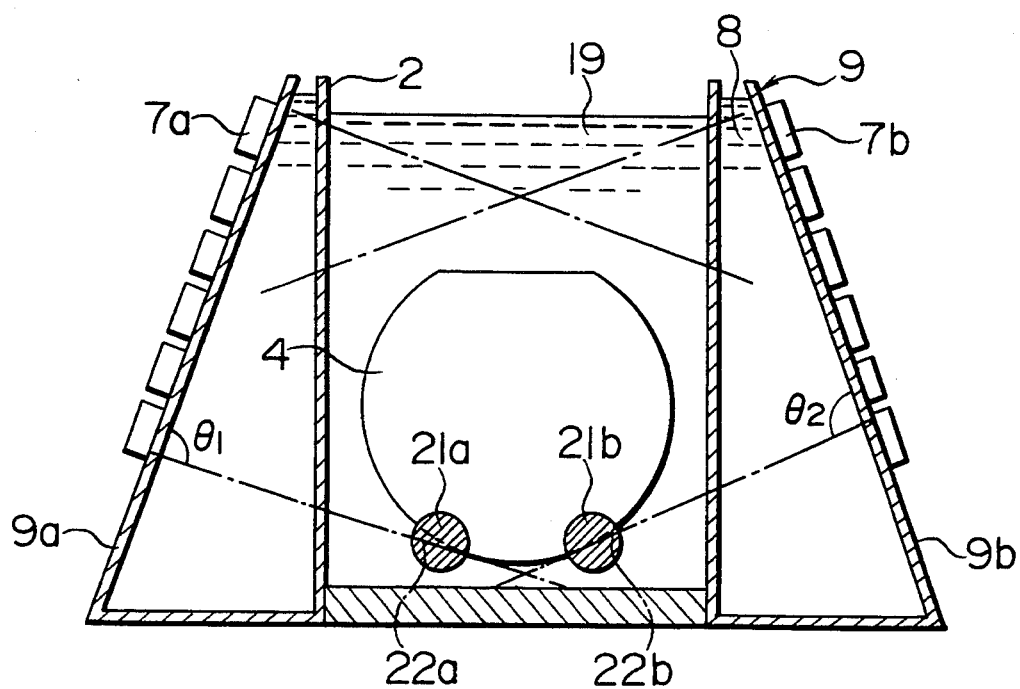
FIG. 4 is a schematic cross-sectional view of a third embodiment of the cleaning apparatus according to the present invention.
Figure 5:
FIG. 5 is a schematic plan view of a supporting base of the cleaning apparatus of FIG. 3.
Figure 6:
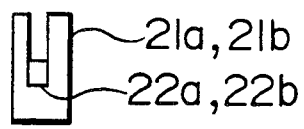
FIG. 6 is a schematic side elevational view of the supporting base of the cleaning apparatus of FIG. 3.

FIG. 4 is a schematic cross-sectional view of a third embodiment of the cleaning apparatus according to the present invention. In this apparatus, side walls 9a and 9b of the outer tank 9 are inclined such that the angles $\theta_1$ and $\theta_2$ between grooves 22a and 22b formed in the supporting bases 21a and 21b and the side walls 9a and 9b are 90° or to more, as shown in FIG. 5 and 6. That is, the side walls 9a and 9b of the outer tank 9 are inclined such that the supporting bases 21a and 21b do not block the ultrasonic waves generated by the ultrasonic oscillators 7a and 7b from reaching the substrate 4. Consequently, ultrasonic waves irradiate the entire substrate 4, and the substrate 4 can thus be cleaned effectively.

Fourth Embodiment

Figure 7:
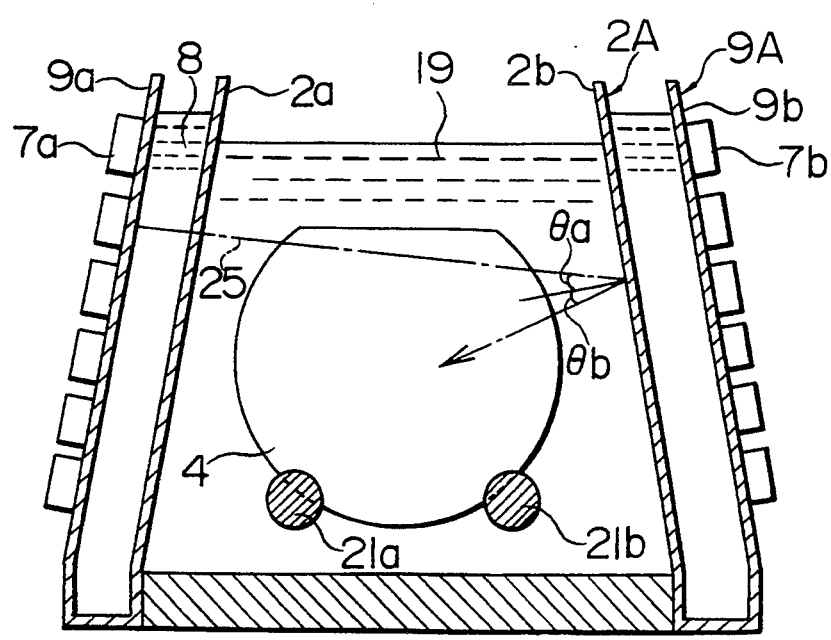
FIG. 7 is a schematic cross-sectional view of a fourth embodiment of the cleaning apparatus according to the present invention.

FIG. 7 is a schematic cross-sectional view of a fourth embodiment of the cleaning apparatus according to the present invention. In this apparatus, both the side walls 9a and 9b of an outer tank 9A and side walls 2a and 2b of an inner tank 2A are inclined so that the ultrasonic waves from the ultrasonic oscillators 7a can be reflected in a downward direction by the side wall 2b of the inner tank 2A. The reflected ultrasonic waves irradiate the substrate 4. Therefore, ultrasonic waves reflected by the side walls 2a and 2b are also utilized for cleaning, and cleaning efficiency can thus be improved.

Assuming that the chemical 19 is pure water and that the side walls 2a and 2b of the inner tank 2A are made of quartz, the critical angle $\theta c$ of the ultrasonic waves passing from water to quartz is given by sin $\theta c = 1483/6570$ and is hence 15°. At this angle, the ultrasonic waves incident on the side wall 2b from the chemical 19 are all reflected by the quartz surface into the chemical 19. That is, the reflected ultrasonic waves irradiate the substrate 4 more effectively by increasing the angle of incidence $\theta a$ of the ultrasonic waves to the critical angle $\theta c$ or above. At that time, the side walls 2a, 2b, 9a and 9b are preferably inclined such that incidence $\theta a$ is larger than the critical angle determined by the material of the chemical 19 and the inclination of the inner tank 2A is, for example, 10° or more.

Fifth Embodiment

Figure 8:
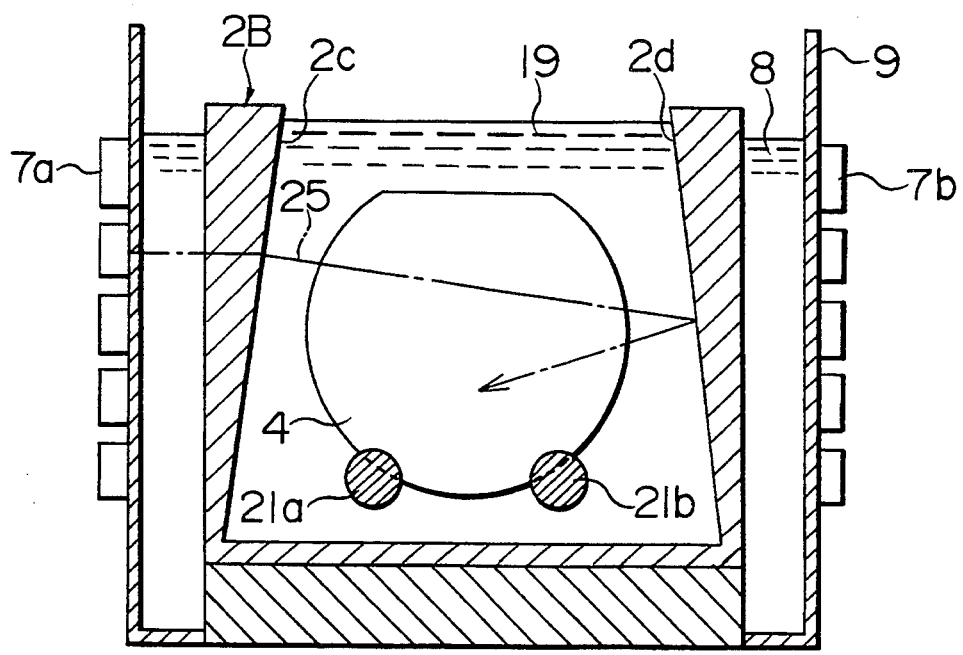
FIG. 8 is a schematic cross-sectional view of a fifth embodiment of the cleaning apparatus according to the present invention.

FIG. 8 is a schematic cross-sectional view of a fifth embodiment of the cleaning apparatus according to the present invention. In this apparatus, side walls 2c and 2d of an inner tank 2B have a wedge-shaped form with an upper surface wider than the bottom surface. Ultrasonic waves 25 generated by the ultrasonic oscillators 7a propagate through the ultrasonic wave transmission medium 8 contained in the outer tank 9, are refracted by the side wall 2c of the inner tank 2B and then enter the inner tank 2B. The ultrasonic waves 25 in the inner tank 2B irradiate the substrate 4 and thereby enhance the cleaning effect of the chemical 19. The ultrasonic waves 25 passing through the substrate 4 are reflected by the side wall 2d of the inner tank 2B and irradiate the substrate 4 again. Hence, the cleaning effect of the substrate 4 can be enhanced.

Sixth Embodiment

Figure 9:
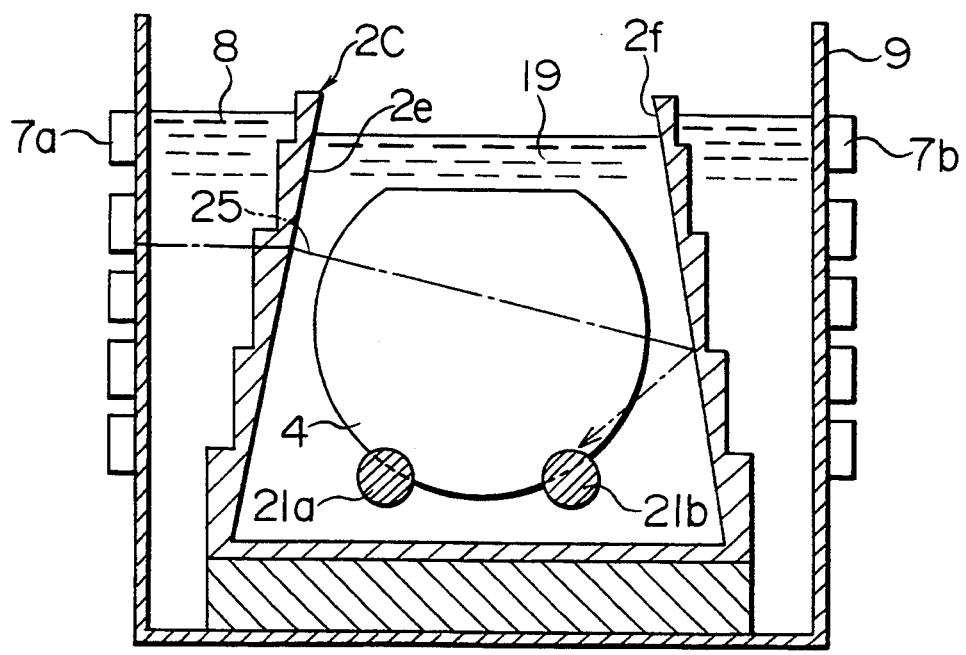
FIG. 9 is a schematic cross-sectional view of a sixth embodiment of the cleaning apparatus according to the present invention.

FIG. 9 is a schematic cross-sectional view of a sixth embodiment of the cleaning apparatus according to the present invention. In this apparatus, side walls 2e and 2f of an inner tank 2C have a i.e., stepped wedge-shaped form and are thus thin. Ultrasonic waves 25 propagate in the same manner as that of the fifth embodiment. However, since the side walls $2e$ and $2f$ of the inner tank 2C are reduced, the transmittance of the ultrasonic waves propagating from the outer tank 9 into the inner tank 2C can be increased with respect to the side walls $2e$ and $2f$.

Figure 10:
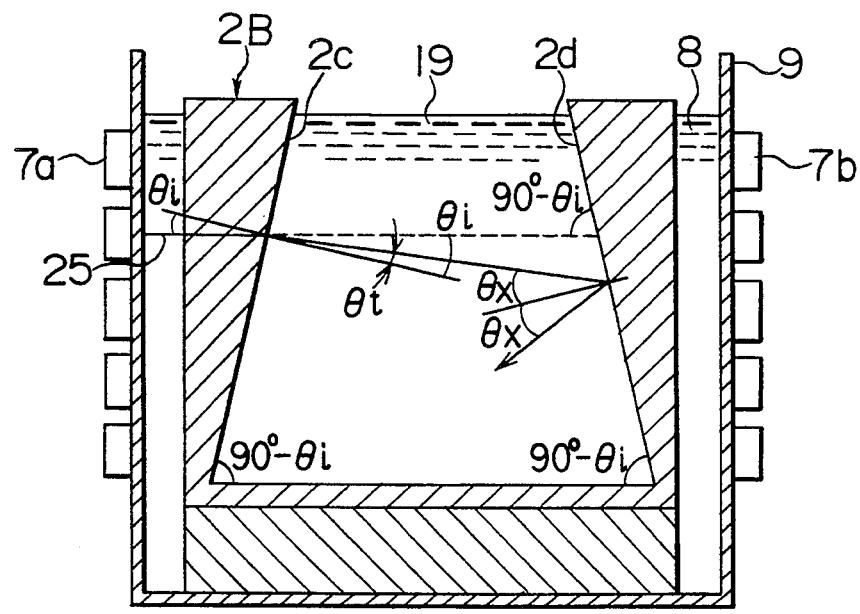
FIG. 10 is a schematic cross-sectional view of the cleaning apparatus, illustrating refraction and reflection of ultrasonic waves in the fifth and sixth embodiments.
Figure 11:
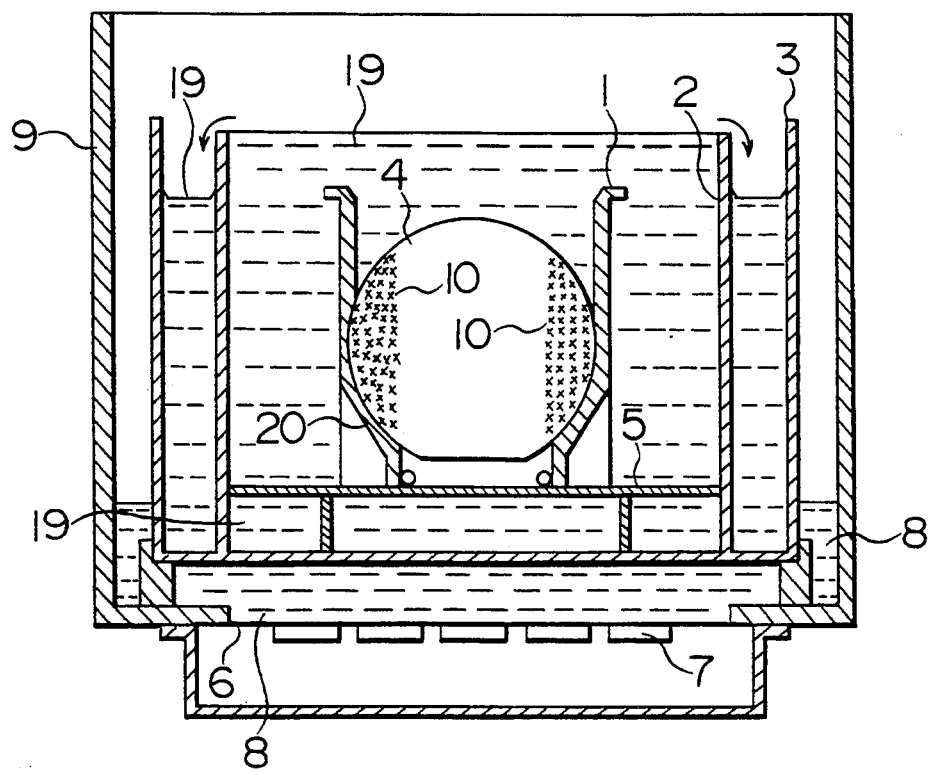
FIG. 11 is a schematic cross-sectional view of a conventional cleaning apparatus.
Figure 12:
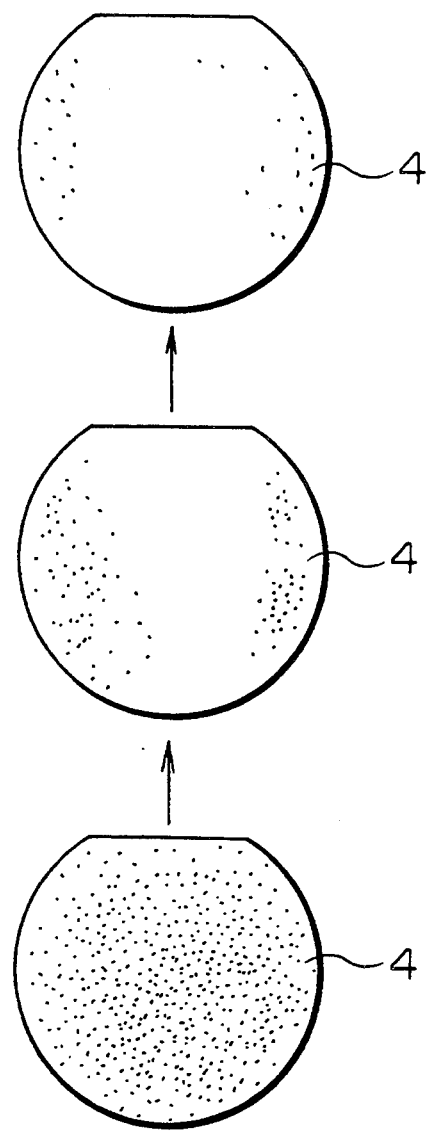
FIG. 12 is a plan view of the substrate to be cleaned, illustrating how contamination of the substrate changes when the substrate is cleaned by the conventional cleaning apparatus.

Now, the fifth embodiment is compared with the sixth embodiment regarding irradiation by the ultrasonic waves 25 perpendicular to the inner tank 2B, as shown in FIG. 10. In the fifth embodiment, the relation between the transmittance D at the side wall $2c$ of the inner tank 2B, the angle of incidence $\theta i$ at the side wall $2c$ of the inner tank 2B and the angle of reflection $\theta x$ are given by the following equation. In FIG. 10, $\theta t$ is the angle of transmission of the ultrasonic waves which enter the inner tank 2B.

$$1/\theta = \cos^2(2\pi b/\lambda_1) + (\rho 1 C1/\rho 0 C0 + \rho 0 C0/\rho 1 C1)^2 \sin^2(2\pi b/\lambda 1)$$

where $\rho 0$ is the density of the chemical 19 (which is $0.992 \times 10^3$ Kg/m$^3$, if the chemical 19 is water), $\rho 1$ is the density of the side walls $2c$ and $2d$ of the inner tank 2B (which is $2.7 \times 10^3$ Kg/m$^3$, if the side walls are made of quartz), C0 is the sonic velocity of the ultrasonic waves in the chemical 19 (which is 1483 m/sec, if the chemical 19 is water), C1 is the sonic velocity of the ultrasonic waves in the side walls $2c$ and $2d$ of the inner tank 2B (which is 5570 m/sec, if the side walls are made of quartz), b is the average thickness of the side walls $2c$ and $2d$ of the inner tank 2B, and $\lambda 1$ is the wavelength of the ultrasonic waves in the side walls $2c$ and $2d$ of the inner tank 2B ($\lambda 1 = 5570/1633 \ 10^6 = 0.00557$ m, if the side walls are made of quartz and if the frequency of the ultrasonic waves is 1 MHz).

Consequently, from $\theta x = 2\theta i - \sin^{-1}\{1483/5570 \sin\theta i\}$, when $\theta i = 3°$, $D = 25.5\%$, $\theta x = 5.20°$ and $b = 7.9$ mm
when $\theta i = 5°$, $D = 11.2\%$, $\theta x = 8.67°$ and $b = 13.1$ mm
when $\theta i = 7°$, $D = 6.4\%$, $\theta x = 12.14°$ and $b = 18.4$ mm
when $\theta i = 10°$, $D = 3.1\%$, $\theta x = 17.35°$ and $b = 26.4$ mm
From the above results, it is clear that all the ultrasonic waves 25 can be reflected by the side wall $2d$ of the inner tank 2B when $\theta i \geq 8°$. The multi-stage wedge-shaped side walls $2e$ and $2f$ shown in FIG. 9 are thinner than the side walls $2c$ and $2d$ shown in FIG. 8 but still assure $\theta i \geq 8°$. That is, in the case of, for example, five-stage wedges, when $\theta i = 10$, $b = 17.6\%$. Therefore, the transmittance D at the side walls $2e$ and $2f$ can be made twice that of the side walls $2c$ and $2d$. The transmittance D is further increased by further increasing the number of stages of the wedge.

In the fifth embodiment, the outer tank 9 and the outer side walls of the inner tank 2B are parallel, and ultrasonic waves from the ultrasonic oscillators 7 are perpendicular to the inner tank 2B. However, the average thickness b of the inner tank may be reduced to increase the transmittance D by providing an outer tank 9 having an inversely tapered side wall and thereby increasing $\theta x$ without increasing $\theta i$.

What is claimed is:
1. A cleaning apparatus comprising:
a tank having a base wall and first and second opposing side walls extending from the base wall;
at least one ultrasonic oscillator disposed on each of the first and second side walls for generating ultrasonic waves directed into the tank; and
support means for supporting a plurality of semiconductor wafers within the tank between the first and second side walls with each portion of a face of each wafer disposed along an unobstructed path of ultrasonic waves from one of the ultrasonic oscillators, the support means comprising first and second supports, each support being disposed at a different distance from the base wall for contacting a peripheral edge of each of the wafers at different, respective, distances from the base wall with at most one support contacting the peripheral edge of a wafer at any distance from the base wall.

2. The cleaning apparatus according to claim 1 wherein each of the supports comprises a disk having a groove formed therein for receiving the peripheral edge of a semiconductor wafer.

3. The cleaning apparatus according to claim 1 wherein the side walls are parallel.

4. The cleaning apparatus according to claim 1 wherein the face of a wafer supported by the support means is perpendicular to the side walls.

5. The cleaning apparatus according to claim 1 wherein the ultrasonic oscillators are disposed on the first and second side walls to generate ultrasonic waves directed parallel to the base wall of the tank.

6. (Amended) A cleaning apparatus comprising:
a tank having a base wall and first and second opposing side walls extending from the base wall, the first and second walls being inclined toward each other;
first and second ultrasonic oscillators disposed on the first and second side walls, respectively, for generating ultrasonic waves directed into the tank along paths that are oblique with respect to the base wall; and
a support base disposed within the tank between the first and second ultrasonic oscillators for supporting a semiconductor wafer, the support base comprising first and second supports each having a groove for receiving a peripheral edge of a semiconductor wafer, each grooved support being oriented for exposing each part of a semiconductor wafer received in the first and second supports to ultrasonic waves from at least one of the first and second ultrasonic oscillators.

7. A cleaning apparatus comprising:
a first tank having a base wall and first and second opposing side walls extending from the base wall;
first and second ultrasonic oscillators disposed on the first and second side walls, respectively, for generating ultrasonic waves directed into the first tank;
a support base for supporting a semiconductor wafer; and
a second tank disposed inside the first tank containing the support base and having third and fourth opposing side walls sloped toward one another for reflecting ultrasonic waves from the ultrasonic oscillators entering the second tank toward a semiconductor wafer supported by the support base.

8. The cleaning apparatus according to claim 7 wherein the support base supports a semiconductor wafer for receiving ultrasonic waves directly from one of the first and second ultrasonic oscillators and reflected ultrasonic waves reflected from one of the third and fourth side walls.

9. The cleaning apparatus according to claim 7 wherein the first and second side walls are generally parallel to each other.

10. The cleaning apparatus according to claim 7 wherein the first and second side walls are respectively parallel to the third and fourth side walls.

11. The cleaning apparatus according to claim 7 wherein each of the third and fourth side walls has an outer surface and an inner surface, the outer surfaces of the third and fourth side walls are parallel to each other, and the inner surfaces of the third and fourth side walls slope toward each other.

12. The cleaning apparatus according to claim 7 comprising a plurality of ultrasonic oscillators disposed on the first side wall and a plurality of ultrasonic oscillators disposed on the second side wall wherein each of the third and fourth side walls has a planar inner surface a step-shaped outer surface, the planar surfaces of the third and fourth side walls sloping toward each other.

13. A cleaning apparatus comprising:
   a tank having a base wall and first and second opposing side walls extending from the base wall;
   first and second ultrasonic oscillators disposed on the first and second side walls, respectively, for generating ultrasonic waves directed into the tank; and
   a support base disposed within the tank between the first and second side walls for supporting a semiconductor wafer at a peripheral edge of the wafer and comprising a disk having a circular periphery and a groove with a planar bottom surface extending between two locations on the periphery of the disk for the peripheral edge of a semiconductor wafer.

* * * * *

UNITED STATES PATENT AND TRADEMARK OFFICE
CERTIFICATE OF CORRECTION

PATENT NO. : 5,379,785
DATED : January 10, 1995
INVENTOR(S) : Ohmori et al

It is certified that error appears in the above-indentified patent and that said Letters Patent is hereby corrected as shown below:

Column 6, line 24, delete "(Amended)";

Column 8, line 15, after "for" insert --receiving --.

Signed and Sealed this

Sixteenth Day of May, 1995

Attest:

BRUCE LEHMAN

*Attesting Officer*   *Commissioner of Patents and Trademarks*